US010700266B2

(12) United States Patent
Hong et al.

(10) Patent No.: US 10,700,266 B2
(45) Date of Patent: Jun. 30, 2020

(54) MTJ STRUCTURE HAVING VERTICAL MAGNETIC ANISOTROPY AND MAGNETIC ELEMENT INCLUDING THE SAME

(71) Applicant: Industry-University Cooperation Foundation Hanyang University, Seoul (KR)

(72) Inventors: Jin Pyo Hong, Seoul (KR); Ja Bin Lee, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 9 days.

(21) Appl. No.: 15/544,356

(22) PCT Filed: Jan. 6, 2016

(86) PCT No.: PCT/KR2016/000107
§ 371 (c)(1),
(2) Date: Jul. 18, 2017

(87) PCT Pub. No.: WO2016/117853
PCT Pub. Date: Jul. 28, 2016

(65) Prior Publication Data
US 2018/0013059 A1 Jan. 11, 2018

(30) Foreign Application Priority Data
Jan. 19, 2015 (KR) .................. 10-2015-0008602

(51) Int. Cl.
*H01L 43/10* (2006.01)
*G11C 11/16* (2006.01)
(Continued)

(52) U.S. Cl.
CPC ............ *H01L 43/08* (2013.01); *G11C 11/161* (2013.01); *H01F 10/123* (2013.01);
(Continued)

(58) Field of Classification Search
CPC ......... H01L 43/08; H01L 43/02; H01L 43/12; H01L 27/222; H01L 43/10;
(Continued)

(56) References Cited

U.S. PATENT DOCUMENTS 9,824,711 B1 * 11/2017 Tripathy ................ G11B 5/667
2011/0062537 A1 * 3/2011 Oh ........................ B82Y 25/00
257/421
(Continued)

FOREIGN PATENT DOCUMENTS

KR 10-2012-0006056 A 1/2012
KR 10-1476932 B1 12/2014
(Continued)

OTHER PUBLICATIONS

M.S. Jeon et al., "Effective of Tungsten Seed Layer on Perpendicular Magnetic Anisotropy for $Co_2FeAl$ Full-Heuster Half-Metal Based Perpendicular Magnetic Tunnel Junctions", 226th Meeting on the Electrochemical Society, Oct. 8, 2014, 3 pages.
(Continued)

*Primary Examiner* — Steven H Loke
*Assistant Examiner* — Juanita B Rhodes
(74) *Attorney, Agent, or Firm* — Sughrue Mion, PLLC

(57) ABSTRACT

An MTJ structure having vertical magnetic anisotropy is provided. The MTJ structure having vertical magnetic anisotropy can comprise: a substrate; an artificial antiferromagnetic layer located on the substrate; a buffer layer located on the artificial antiferromagnetic layer, and including W or an alloy containing W; a first ferromagnetic layer
(Continued)

located on the buffer layer, and having vertical magnetic anisotropy; a tunneling barrier layer located on the first ferromagnetic layer; and a second ferromagnetic layer located on the tunneling barrier layer, and having vertical magnetic anisotropy. Accordingly, in the application of bonding the artificial antiferromagnetic layer with a CoFeB/MgO/CoFeB structure, the MTJ structure having improved thermal stability at high temperature can be provided by using the buffer layer therebetween.

4 Claims, 6 Drawing Sheets

(51) Int. Cl.
    *H01F 10/12*     (2006.01)
    *H01F 10/32*     (2006.01)
    *H01L 27/22*     (2006.01)
    *H01L 43/08*     (2006.01)
    *H01L 43/02*     (2006.01)
    *H01L 43/12*     (2006.01)

(52) U.S. Cl.
    CPC ....... *H01F 10/3272* (2013.01); *H01L 27/222* (2013.01); *H01L 43/02* (2013.01); *H01L 43/10* (2013.01); *H01L 43/12* (2013.01); *H01F 10/329* (2013.01); *H01F 10/3254* (2013.01)

(58) Field of Classification Search
    CPC .. H01F 10/3272; H01F 10/123; H01F 10/329; H01F 10/3254; G11C 11/161
    See application file for complete search history.

(56) References Cited

U.S. PATENT DOCUMENTS

| | | |
|---|---|---|
| 2012/0070695 A1* | 3/2012 | Kitagawa ................. G11B 5/66 428/828 |
| 2013/0130406 A1 | 5/2013 | Zhu et al. |
| 2014/0284539 A1* | 9/2014 | Eeh .......... H01L 43/12 257/4 |
| 2015/0076633 A1* | 3/2015 | Siddik ..................... H01L 43/10 257/421 |
| 2015/0235688 A1* | 8/2015 | Yamane ................ G11C 11/161 257/421 |
| 2015/0340598 A1* | 11/2015 | Gan ....................... H01L 43/08 257/421 |
| 2016/0111632 A1* | 4/2016 | Sandhu .................. H01L 43/12 257/421 |
| 2018/0287052 A1* | 10/2018 | Wang .................... H01L 43/04 |

FOREIGN PATENT DOCUMENTS

| | | |
|---|---|---|
| KR | 101476932 B1 * | 12/2014 |
| KR | 101476932 B1 * | 12/2014 |
| WO | WO-2015160094 A2 * | 10/2015 ........... G11C 11/161 |

OTHER PUBLICATIONS

Yao-Jen Chang et al., Perpendicular Magnetic Tunnel Junctions with Synthetic Antiferromagnetic Pinned Layers based on [Co/Pd] Multilayers, Journal of Applied Physics, Apr. 12, 2013, 5 pages, 17B909, vol. 113.
International Search Report for PCT/KR2016/000107 dated Apr. 28, 2016 [PCT/ISA/210].
Written Opinion for PCT/KR2016/000107 dated Apr. 28, 2016 [PCT/ISA/237].

* cited by examiner

MTJ STRUCTURE HAVING VERTICAL MAGNETIC ANISOTROPY AND MAGNETIC ELEMENT INCLUDING THE SAME

CROSS REFERENCE TO RELATED APPLICATIONS

This application is a National Stage of International Application No. PCT/KR2016/000107, filed on Jan. 6, 2016, which claims priority from Korean Patent Application No. 10-2015-0008602, filed on Jan. 19, 2015, the contents of all of which are incorporated herein by reference in their entirety.

TECHNICAL FIELD

The present invention relates to a magnetic tunnel junction (MTJ) structure having vertical magnetic anisotropy, and more particularly, to an MTJ structure having vertical magnetic anisotropy with thermal stability even at high temperature, and a magnetic element including the same.

BACKGROUND ART

Next generation nonvolatile memories that are being focused on as new information storage media include a ferroelectric random access memory (FeRAM), a magnetoresistive random access memory (MRAM), a resistive random access memory (ReRAM), a phase-change memory (PRAM), and the like. These memories have their own advantages, and research and development thereon have been actively progressing in a direction suitable for their use.

An MRAM, among these memories, is a memory element using a quantum mechanical effect called magnetoresistance, is an element which is capable of storing nonvolatile data, with features of high density and high responsiveness with low power consumption, and is a large-capacity memory element that can replace a dynamic random access memory (DRAM) which is a currently widely used memory element.

As a magnetoresistive effect, two effects such as giant magnetoresistance (GMR) and tunnel magnetoresistance (TMR) are known.

An element using a GMR effect stores information by using a phenomenon in which a resistance of a conductor located between two ferromagnetic layers is changed according to spin directions of the upper and lower ferromagnetic layers. However, since a magnetoresistance (MR) ratio of a GMR element, which indicates a rate of change of a magnetoresistance value, is as low as about 10%, a reading signal of stored information is small. Therefore, securing a read margin is the greatest challenge in realizing the MRAM.

Meanwhile, as a representative element using a TMR effect, a magnetic tunnel junction (MTJ) element using a change of magnetoresistance according to an MTJ effect is known.

The MTJ element has a laminated structure of a ferromagnetic layer/an insulating layer/a ferromagnetic layer. In the MTJ element, when spin directions of upper and lower ferromagnetic layers are the same, tunneling probability between the two ferromagnetic layers with a tunneling insulating layer interposed therebetween is maximized, and thus a resistance value is minimized. On the other hand, when the spin directions thereof are opposite, tunneling probability therebetween is minimized, and thus a resistance value is maximized.

In order to realize these two spin states, a magnetization direction of either one of the ferromagnetic layers (magnetic material films) is set to be fixed and not to be influenced by external magnetization. Generally, a ferromagnetic layer having a fixed magnetization direction is referred to as a fixed layer or a pinned layer.

A magnetization direction of the other ferromagnetic layer (the other magnetic material film) may be the same as or opposite a magnetization direction of a fixed layer according to a direction of an applied magnetic field. The ferromagnetic layer in this case is generally referred to as a free layer, and serves to store information.

Currently, MTJ elements having an MR ratio more than 50% as a rate of change of resistance are obtained, and are becoming the mainstream of MRAM development.

Meanwhile, an MTJ element using a vertical magnetic anisotropic material among these MTJ elements has entered the spotlight.

Specifically, research on application of an MTJ element using a vertical magnetic anisotropic material to a spin-transfer torque magnetic random access memory (STT-MRAM) or the like has been actively progressing.

A STT-type recording method refers to a method of inducing magnetization reversal by directly injecting a current into an MTJ rather than applying an external magnetic field. The STT-type recording method is advantageous for high integration because there is no need for a separate external conducting wire.

In an MTJ element using vertical magnetic anisotropy, a material used as a pinning layer has an artificial antiferromagnetic material structure. The structure conventionally has an $L_1/Ru/L_1$ structure in which Ru is inserted between ferromagnetic layers such as CoPd, CoPt, [Co/Pd], or [Co/Pt].

Currently, in order to apply an STT-MRAM element, it is necessary to finally bond a selection element such as a transistor. A process temperature of such a selection element is about 400° C., and the temperature has a bad influence on the above-described artificial antiferromagnetic material structure.

According to reports so far, Pd or Pt included in a vertical magnetic anisotropic material used to form artificial antiferromagnetic bonding at a temperature of 400° C. to 450° C. is very rapidly diffused during a high-temperature heat treatment process, and thus overall characteristics of the element are degraded.

This diffusion of Pd or Pt not only includes diffusion into an artificial antiferromagnetic layer but also diffusion toward a direction of a seed layer and a capping layer which are used therein. Diffusion into the seed layer and the capping layer has a potential to worsen an interfacial state with CoFeB/MgO/CoFeB bonding.

Therefore, in a structure including the artificial antiferromagnetic material structure, there is a need to develop an MTJ structure having vertical magnetic anisotropy with thermal stability at high temperature.

DOCUMENT OF RELATED ART

Patent Document

Korean Patent Application Publication No. 10-1999-0077377

DISCLOSURE

Technical Problem

The present invention is directed to providing a magnetic tunnel junction (MTJ) structure having vertical magnetic anisotropy with thermal stability at high temperature in a structure including an artificial antiferromagnetic material structure, and a magnetic element including the same.

Technical Solution

One aspect of the present invention provides a magnetic tunnel junction (MTJ) structure having vertical magnetic anisotropy. The MTJ structure may include a substrate, an artificial antiferromagnetic layer located on the substrate, a buffer layer located on the artificial antiferromagnetic layer and including W or an alloy containing W, a first ferromagnetic layer located on the buffer layer and having vertical magnetic anisotropy, a tunneling barrier layer located on the first ferromagnetic layer, and a second ferromagnetic layer located on the tunneling barrier layer and having vertical magnetic anisotropy.

The artificial antiferromagnetic layer may include a third ferromagnetic layer, a separation layer located on the third ferromagnetic layer, and a fourth ferromagnetic layer located on the separation layer.

The third ferromagnetic layer or the fourth ferromagnetic layer may include a CoPd, CoPt, [Co/Pd]$_n$, [Co/Pt]$_n$, FePd, FePt, [Fe/Pd]$_n$, or [Fe/Pt]$_n$ structure. The separation layer may include Ru, Ta, or Ir.

A thickness of the buffer layer may range from 2 nm to 5 nm.

The first ferromagnetic layer may include a CoFeB material. The tunneling barrier layer may include at least one selected from a group consisting of MgO, $Al_2O_3$, $HfO_2$, $TiO_2$, $Y_2O_3$ and $Yb_2O_3$.

Another aspect of the present invention provides an MTJ structure having vertical magnetic anisotropy. The MTJ structure may include a substrate, a second ferromagnetic layer located on the substrate and having vertical magnetic anisotropy, a tunneling barrier layer located on the second ferromagnetic layer, a first ferromagnetic layer located on the tunneling barrier layer and having vertical magnetic anisotropy, a buffer layer located on the first ferromagnetic layer and including W or an alloy containing W, and an artificial antiferromagnetic layer located on the buffer layer.

A thickness of the buffer layer may range from 2 nm to 5 nm.

The first ferromagnetic layer may include a CoFeB material.

Still another aspect of the present invention provides a magnetic element. The magnetic element may include a plurality of digit lines, a plurality of bit lines configured to cross upper portions of the digit lines, and the above-described MTJ structure interposed between the digit line and the bit line.

Advantageous Effects

According to the present invention, in applications in which an artificial antiferromagnetic layer is bonded to a CoFeB/MgO/CoFeB structure, the use of a buffer layer therebetween can prevent diffusion of a material such as Pd or Pt in the artificial antiferromagnetic layer into a CoFeB layer.

Furthermore, since a W-based material is used as a material of a buffer layer, coherent tunneling with an MgO tunneling oxide layer can be expected in an actual operation of the element by inducing continuity of a crystalline structure, so that a magnetoresistance ratio can be increased and power consumption can be reduced.

Therefore, a magnetic tunnel junction (MTJ) structure having vertical magnetic anisotropy with improved thermal stability even at high temperature can be provided.

Effects of the present invention are not limited to the above-described effects and other unmentioned effects may be clearly understood by those skilled in the art from the following descriptions.

MODES OF THE INVENTION

Figure 1:
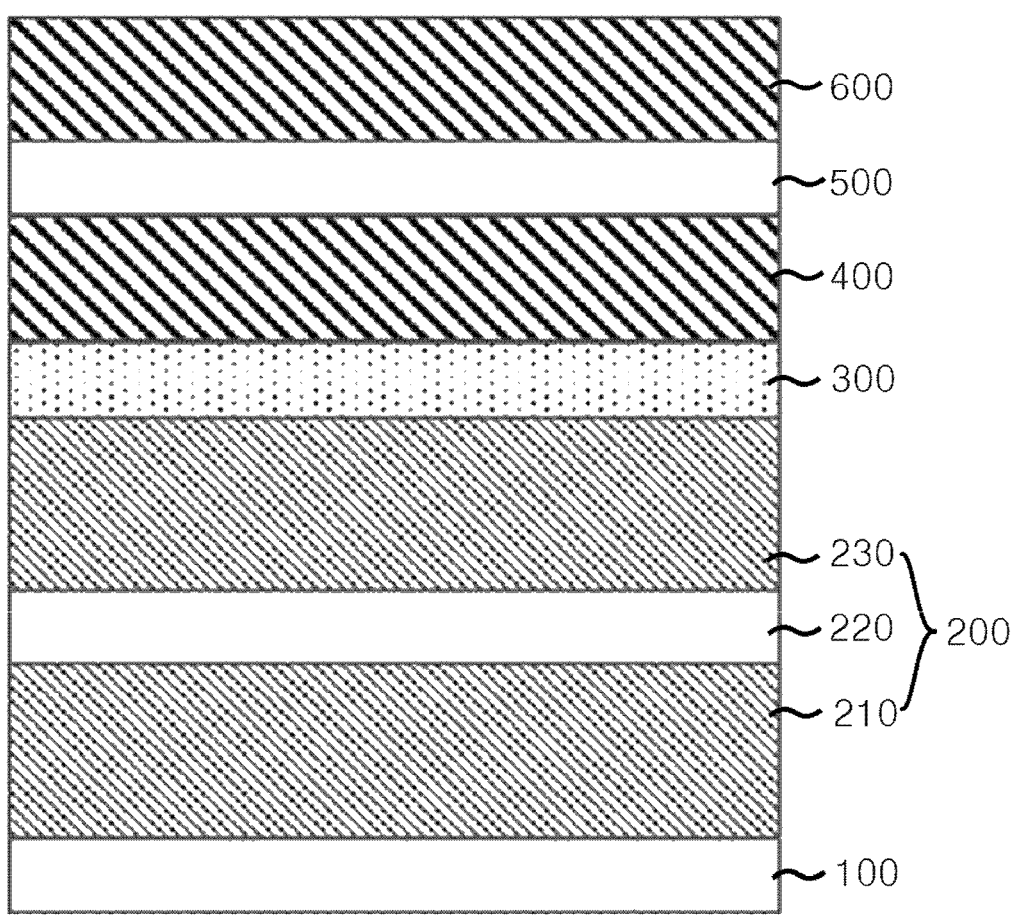
FIG. 1 is a cross-sectional view illustrating a magnetic tunnel junction (MTJ) structure having vertical magnetic anisotropy according to one embodiment of the present invention.

Hereinafter, embodiments of the present invention will be described in detail with reference to the accompanying drawings.

While the present invention is susceptible to various modifications and alternative forms, specific embodiments thereof are shown by way of example in the drawings and will herein be described in detail. However, it should be understood that there is no intent to limit the invention to the particular forms disclosed but rather the invention is to cover all modifications, equivalents, and alternatives falling within the spirit and scope of the invention defined by the appended claims.

When an element such as a layer, a region, and a substrate is referred to as being disposed "on" another element, it should be understood that the element may be directly formed on the other element or an intervening element may be interposed therebetween.

It should be understood that, although the terms "first," "second," etc. may be used herein to describe various elements, components, areas, layers, and/or regions, these elements, components, areas, layers, and/or regions are not limited by these terms.

Further, the term "A/B/C structure" used in the present invention refers to a structure in which a B layer and a C layer are sequentially stacked on an A layer.

Further, the term "[A/B]$_n$ structure" refers to a structure in which A layers and B layers are alternately, repeatedly stacked n times. Where, n is an integer greater than or equal to 1.

A magnetic tunnel junction (MTJ) structure having vertical magnetic anisotropy according to one embodiment of the present invention will be described.

FIG. 1 is a cross-sectional view illustrating an MTJ structure having vertical magnetic anisotropy according to one embodiment of the present invention. In this case, the MTJ structure of FIG. 1 is a bottom pinned structure.

Referring to FIG. 1, the MTJ structure having vertical magnetic anisotropy according to one embodiment of the present invention includes a substrate 100, an artificial antiferromagnetic layer 200, a buffer layer 300, a first ferromagnetic layer 400, a tunneling barrier layer 500, and a second ferromagnetic layer 600.

Substrates formed of various known materials may be used as the substrate 100. For example, the substrate 100 may be implemented as a silicon substrate. Further, the substrate 100 may also be implemented as an electrode. On the other hand, the substrate 100 may be omitted in some cases. Meanwhile, the MTJ structure having vertical magnetic anisotropy according to one embodiment of the present invention may further include a seed layer (not illustrated) for growing an artificial antiferromagnetic layer on the substrate 100.

The artificial antiferromagnetic layer 200 is located on the substrate 100. The artificial antiferromagnetic layer 200 serves to fix a magnetization direction of the first ferromagnetic layer 400 to be described below.

The artificial antiferromagnetic layer 200 may include a third ferromagnetic layer 210, a separation layer 220 located on the third ferromagnetic layer 210, and a fourth ferromagnetic layer 230 located on the separation layer 220.

The third ferromagnetic layer 210 or the fourth ferromagnetic layer 230 may include a CoPd, CoPt, [Co/Pd]$_n$, [Co/Pt]$_n$, FePd, FePt, [Fe/Pd]$_n$, or [Fe/Pt]$_n$ structure. Also, in this case, the separation layer 220 may include Ru, Ta, or Ir.

For example, the artificial antiferromagnetic layer 200 may have a CoPd/Ru/CoPd structure.

The artificial antiferromagnetic layer 200 may be formed by a conventional deposition method. For example, the artificial antiferromagnetic layer 200 may be formed by a physical vapor deposition method, a chemical vapor deposition method, or a sputtering method.

The buffer layer 300 may be located on the artificial antiferromagnetic layer 200. The buffer layer 300 may include W or an alloy containing W. For example, the buffer layer 300 may include W, WB, or WN.

The buffer layer 300 may be formed by a conventional deposition method. For example, the buffer layer 300 may be formed by a physical vapor deposition method, a chemical vapor deposition method, or a sputtering method.

The buffer layer 300 serves to prevent a material such as Pd, Pt, or the like which is a material in the artificial antiferromagnetic layer 200 from being diffused into an upper portion, for example, the first ferromagnetic layer 400, at a temperature of about 400° C. which is a memory element process temperature.

When the material such as Pd, Pt, or the like which is a material in the artificial antiferromagnetic layer 200 is diffused into the upper portion, a magnetic property of the first ferromagnetic layer 400 located at the upper portion may be weakened.

Therefore, in the present invention, as the buffer layer 300 is interposed between the artificial antiferromagnetic layer 200 and the first ferromagnetic layer 400, thermal stability may be improved by not degrading an interface state between the artificial antiferromagnetic layer 200 and a structure which is located at the upper portion even at high temperature.

Further, when W or an alloy containing W is used as a material of the buffer layer 300, continuity of a crystalline structure may be induced. For example, since a structure of a W layer is a body centered cubic (BCC) based crystalline structure such as CoFeB when a CoFeB/MgO/CoFeB structure is located on the buffer layer 300 including the W material, coherent tunneling with an MgO tunneling barrier layer may be expected in a subsequent operation of the element, so that a magnetoresistance ratio can be increased and power consumption can be reduced.

Further, a thickness of the buffer layer 300 may range from 2 nm to 5 nm. When the thickness of the buffer layer 300 is less than 2 nm, there is a concern that crystal growth of the first ferromagnetic layer 400 located on the buffer layer 300 may not be performed well. Further, when the thickness of the buffer layer 300 is greater than 5 nm, the material of the buffer layer 300 itself is diffused into the first ferromagnetic layer 400, and thus there is a concern that a magnetic property thereof may be weakened.

The first ferromagnetic layer 400 is located on the buffer layer 300. In this case, the first ferromagnetic layer 400 is made of a ferromagnetic material having vertical magnetic anisotropy as a main element.

For example, the first ferromagnetic layer 400 may include at least one selected from a group consisting of Fe, Co, Ni, B, Si, Zr, Pt, Tb, Pd, Cu, W, Ta, and a mixture thereof in order to have vertical magnetic anisotropy.

For example, the first ferromagnetic layer 400 may include CoFeB. In this case, the first ferromagnetic layer 400 including CoFeB may be formed to have a thickness of 1.5 nm or less in order to have vertical magnetic anisotropy.

The first ferromagnetic layer 400 may be formed by a conventional deposition method. For example, the first ferromagnetic layer 400 may be formed by a physical vapor deposition method, a chemical vapor deposition method, or a sputtering method.

Meanwhile, although the first ferromagnetic layer 400 may already have vertical magnetic anisotropy when forming the layer, the first ferromagnetic layer 400 may have vertical magnetic anisotropy through a method such as heat treatment or the like after forming the layer.

A magnetization direction of the first ferromagnetic layer 400 is fixed by the artificial antiferromagnetic layer, and thus the first ferromagnetic layer 400 serves as a fixed layer.

The tunneling barrier layer 500 is located on the first ferromagnetic layer 400. That is, the tunneling barrier layer 500 is interposed between the first ferromagnetic layer 400 and the second ferromagnetic layer 600 to be described below.

A material of the tunneling barrier layer 500 may be any material as long as it is an insulating material. For example, the insulating material may be at least one selected from a group consisting of $MgO$, $Al_2O_3$, $HfO_2$, $TiO_2$, $Y_2O_3$, and $Yb_2O_3$. Preferably, the tunneling barrier layer 500 may be an MgO layer.

The tunneling barrier layer 500 may be formed by a conventional deposition method. For example, the tunneling barrier layer 500 may be formed by a physical vapor deposition method, a chemical vapor deposition method, or a sputtering method.

The second ferromagnetic layer 600 is located on the tunneling barrier layer 500. As described above, when the first ferromagnetic layer 400 is a fixed layer, the second ferromagnetic layer 600 may be a free layer.

Therefore, a magnetization direction of the free layer 600 may be the same as or opposite the magnetization direction of the fixed layer 400 according to a direction of an applied magnetic field, and thus the free layer 600 serves to store information.

In this case, the second ferromagnetic layer 600 is made of a ferromagnetic material having vertical magnetic anisotropy as a main element. Therefore, the second ferromagnetic layer 600 may include at least one selected from a group consisting of Fe, Co, Ni, B, Si, Zr, Pt, Tb, Pd, Cu, W, Ta, and a mixture thereof in order to have the magnetic anisotropy.

For example, the second ferromagnetic layer 600 may include CoFeB. In this case, a CoFeB layer may be set to have a thin thickness in order to have vertical magnetic anisotropy. For example, the thickness of the CoFeB layer may be set to 1.5 nm or less in order to have vertical magnetic anisotropy.

The second ferromagnetic layer 600 may be formed by a conventional deposition method. For example, the second ferromagnetic layer 600 may be formed by a physical vapor deposition method, a chemical vapor deposition method, or a sputtering method.

Meanwhile, although the second ferromagnetic layer 600 may already have vertical magnetic anisotropy when forming the layer, the second ferromagnetic layer 600 may have vertical magnetic anisotropy through a method such as heat treatment or the like after forming the layer.

Meanwhile, the MTJ structure having vertical magnetic anisotropy according to one embodiment of the present invention may further include a capping layer (not illustrated) located on the second ferromagnetic layer 600. The capping layer may serve as a protective layer, and may protect the second ferromagnetic layer 600 from being oxidized.

An MTJ structure having vertical magnetic anisotropy according to another embodiment of the present invention will be described.

Figure 2:
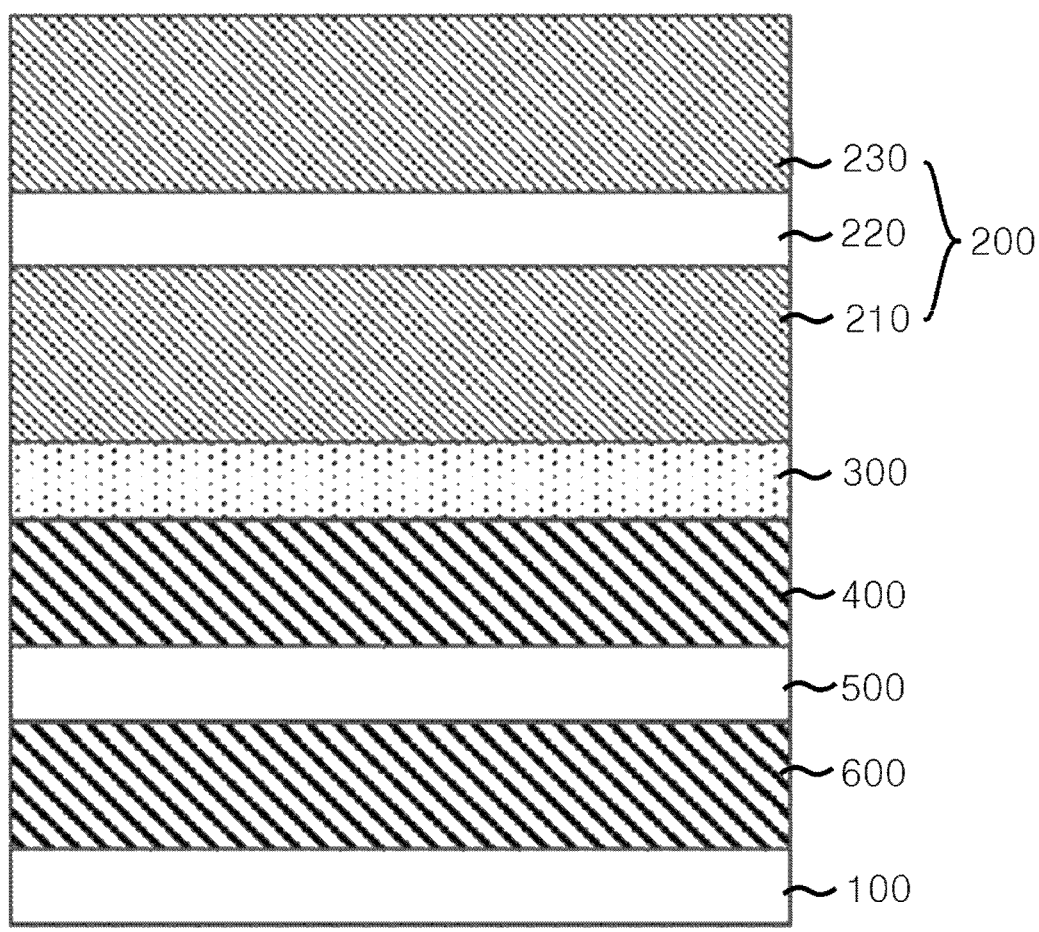
FIG. 2 is a cross-sectional view illustrating an MTJ structure having vertical magnetic anisotropy according to another embodiment of the present invention.

FIG. 2 is a cross-sectional view illustrating an MTJ structure having vertical magnetic anisotropy according to another embodiment of the present invention. In this case, the MTJ structure of FIG. 2 is a top pinned structure.

Referring to FIG. 2, the MTJ structure having vertical magnetic anisotropy according to another embodiment of the present invention may include a substrate 100, a second ferromagnetic layer 600, a tunneling barrier layer 500, a first ferromagnetic layer 400, a buffer layer 300, and an artificial antiferromagnetic layer 200.

Substrates formed of various known materials may be used as the substrate 100. For example, the substrate 100 may be implemented as a silicon substrate. Further, the substrate 100 may also be implemented as an electrode. On the other hand, the substrate 100 may be omitted in some cases.

The second ferromagnetic layer 600 is located on the substrate 100. The MTJ structure of FIG. 2 is a top pinned structure, which is a structure in which an upper portion thereof is a fixed layer and a lower portion thereof is a free layer. Therefore, the second ferromagnetic layer 600 is a free layer and the first ferromagnetic layer 400 to be described below is a fixed layer.

In this case, the second ferromagnetic layer 600 is made of a ferromagnetic material having vertical magnetic anisotropy as a main element. Therefore, the second ferromagnetic layer 600 may include at least one selected from a group consisting of Fe, Co, Ni, B, Si, Zr, Pt, Tb, Pd, Cu, W, Ta, and a mixture thereof in order to have vertical magnetic anisotropy.

The tunneling barrier layer 500 is located on the second ferromagnetic layer 600. A material of the tunneling barrier layer 500 may be any material as long as it is an insulating material. For example, the insulating material may be at least one selected from a group consisting of MgO, $Al_2O_3$, $HfO_2$, $TiO_2$, $Y_2O_3$, and $Yb_2O_3$. Preferably, the tunneling barrier layer 500 may be an MgO layer.

The first ferromagnetic layer 400 is located on the buffer layer 300. In this case, the first ferromagnetic layer 400 is made of a ferromagnetic material having vertical magnetic anisotropy as a main element.

For example, the first ferromagnetic layer 400 may include at least one selected from a group consisting of Fe, Co, Ni, B, Si, Zr, Pt, Tb, Pd, Cu, W, Ta, and a mixture thereof in order to have vertical magnetic anisotropy. For example, the first ferromagnetic layer 400 may include CoFeB. In this case, the first ferromagnetic layer 400 including CoFeB may be formed to have a thickness of 1.5 nm or less in order to have vertical magnetic anisotropy.

The buffer layer 300 may be located on the first ferromagnetic layer 400. The buffer layer 300 may include W or an alloy containing W. For example, the buffer layer 300 may include W, WB, or WN.

The buffer layer 300 serves to prevent a material such as Pd, Pt, or the like which is a material in the artificial antiferromagnetic layer 200 to be described below from being diffused into a lower portion, for example, the first ferromagnetic layer 400, at a temperature of about 400° C. which is a memory element process temperature.

Further, continuity of a crystalline structure may be induced by using a W-based material for the buffer layer 300. For example, in a top pinned structure, when high-temperature heat treatment included in the process is performed, so-called reverse-texturing, in which crystallinity of the artificial antiferromagnetic layer 200 located at the upper portion affects the second ferromagnetic layer 600, the tunneling barrier layer 500, and the first ferromagnetic layer 400, may occur. In this case, since W has a BCC structure when a W-based material is used for the buffer layer 300, such reverse texturing may be prevented.

Further, a thickness of the buffer layer 300 may range from 2 nm to 5 nm.

The artificial antiferromagnetic layer 200 may be located on the buffer layer 300. The artificial antiferromagnetic layer 200 serves to fix a magnetization direction of the first ferromagnetic layer 400.

The artificial antiferromagnetic layer 200 may include a third ferromagnetic layer 210, a separation layer 220 located on the third ferromagnetic layer 210, and a fourth ferromagnetic layer 230 located on the separation layer 220.

The third ferromagnetic layer 210 or the fourth ferromagnetic layer 230 may include a CoPd, CoPt, $[CoPd]_n$, $[Co/Pt]_n$, FePd, FePt, $[Fe/Pd]_n$, or $[Fe/Pt]_n$ structure. Also, in this case, the separation layer 220 may include Ru, Ta, or Ir.

For example, the artificial antiferromagnetic layer 200 may have a CoPd/Ru/CoPd structure.

Hereinafter, a magnetic element including the MTJ structure having vertical magnetic anisotropy according to one embodiment of the present invention will be described.

The magnetic element may include a plurality of digit lines, a plurality of bit lines which cross upper portions of the digit lines, and an MTJ structure interposed between the digit line and the bit line.

In this case, the MTJ structure may be the described-above MTJ structure of FIG. 1 or FIG. 2. Therefore, since such an MTJ structure has already been described, detailed description thereof will be omitted.

Therefore, in this case, the MTJ structure will be used as a structure for storing information in an MRAM. Therefore, a magnetic element including an MTJ structure having simultaneously improved thermal stability and an improved magnetoresistance ratio may be provided.

Manufacturing Example 1

For convenience of experimentation, a substrate/seed layer/artificial antiferromagnetic layer/buffer layer structure, which is a part of an MTJ structure as a bottom pinned structure was prepared. In this case, Ta was used as a material of a buffer layer.

Hereinafter, specifically, first, a Ta (3 nm)/Ru (5 nm)/Pd (3 nm) seed layer was deposited on a silicon substrate using a sputtering method. In this case, each of the numbers in parentheses refers to a thickness of a layer. At this time, in the sputtering process, as a sputtering gas, 20 sccm Ar gas, which is an inert gas, at a deposition pressure of 5 mTorr was used.

Then, an artificial antiferromagnetic layer having a [Co (0.3 nm)/Pd (0.3 nm)]$_3$/Ru/[Co (0.3 nm)/Pd (0.3 nm)]$_7$ structure was formed on the seed layer. Specifically, a ferromagnetic layer having a [Co (0.3 nm)/Pd (0.3 nm)]$_3$ structure was deposited on the seed layer by using 30 sccm Ar gas at a deposition pressure of 6.8 mTorr, using an alternating deposition method. Then, after Ru used for a separation layer was deposited to have a thickness of 1.3 nm using 20 sccm Ar gas again at a deposition pressure of 5 mTorr, the ferromagnetic layer having a [Co (0.3 nm)/Pd (0.3 nm)]$_7$ structure was deposited by using the above-described 30 sccm Ar gas at a deposition pressure of 6.8 mTorr, using the alternating deposition method.

Then, a Ta buffer layer having a thickness of 3 nm was deposited on the artificial antiferromagnetic layer by using 20 sccm Ar gas at a deposition pressure of 5 mTorr.

All of the layers described above were deposited using direct current (DC) or radio frequency (RF) sputtering, Ta and Ru were deposited at 8 Watt DC, and Co was deposited at 25 Watt DC. Pd was deposited at 17 Watt RF. All of the layers were deposited under conditions of as low a deposition rate as possible for a smooth interface and good crystallinity.

Manufacturing Example 2

A substrate/seed layer/artificial antiferromagnetic layer/buffer layer structure was prepared by performing Manufacturing Example 2 in the same manner as Manufacturing Example 1 except that Pd was used as a material of a buffer layer.

Manufacturing Example 3

A substrate/seed layer/artificial antiferromagnetic layer/buffer layer structure was prepared by performing Manufacturing Example 3 in the same manner as Manufacturing Example 1 except that Ru was used as a material of a buffer layer.

Manufacturing Example 4

A substrate/seed layer/artificial antiferromagnetic layer/buffer layer structure was prepared by performing Manufacturing Example 4 in the same manner as Manufacturing Example 1 except that W was used as a material of a buffer layer.

Experimental Example

Magnetic properties of the structures in Manufacturing Examples 1 to 4 were analyzed according to room temperature, and heat treatment temperatures of 350° C. and 400° C.

Figure 3:
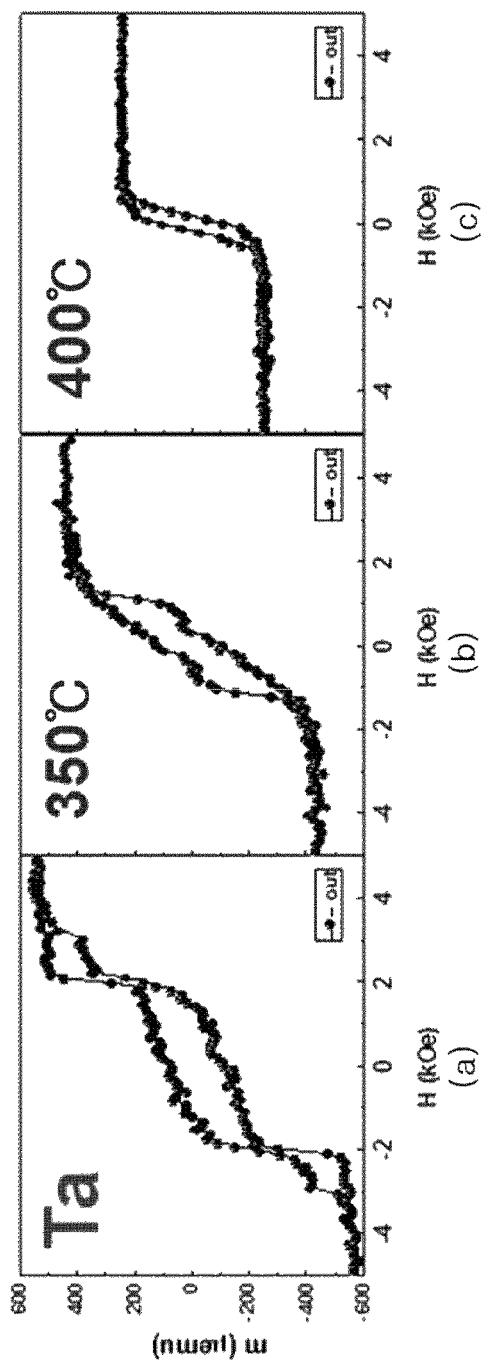
FIGS. 3A to 3C are graphs illustrating magnetic properties according to a heat treatment temperature of a structure according to Manufacturing Example 1.

FIGS. 3A to 3C are graphs illustrating magnetic properties according to a heat treatment temperature of the structure according to Manufacturing Example 1. FIGS. 3A to 3C are graphs respectively illustrating analysis results of magnetic properties at room temperature, at a heat treatment temperature of 350° C., and at a heat treatment temperature of 400° C.

Figure 4:
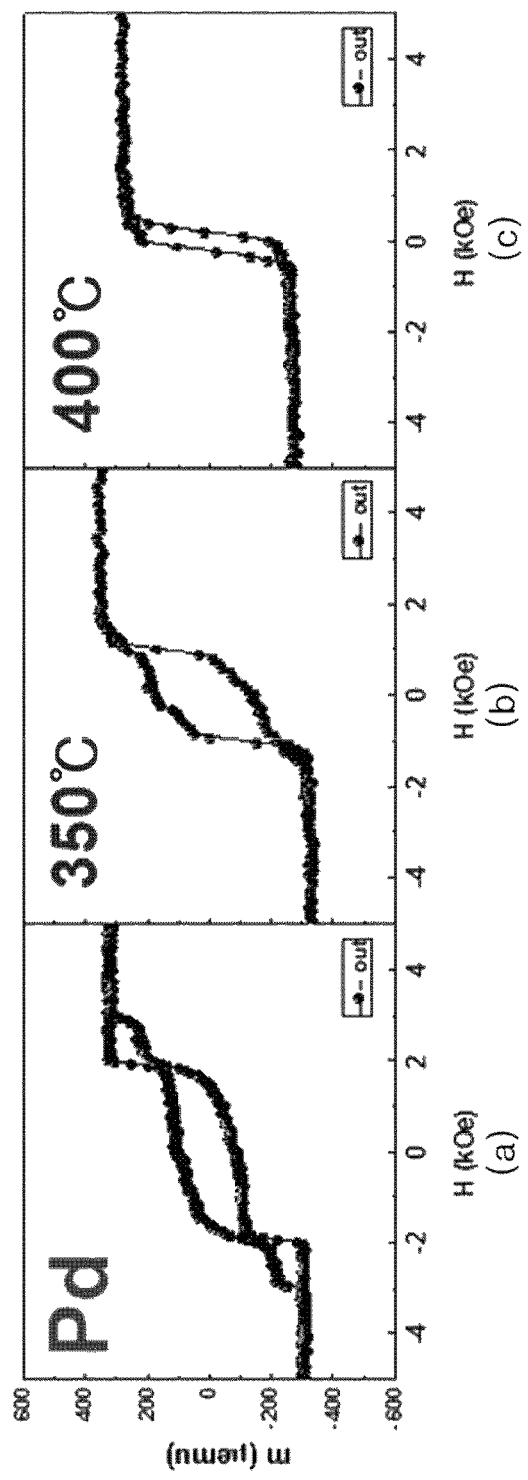
FIGS. 4A to 4C are graphs illustrating magnetic properties according to a heat treatment temperature of a structure according to Manufacturing Example 2.

FIGS. 4A to 4C are graphs illustrating magnetic properties according to a heat treatment temperature of the structure according to Manufacturing Example 2. FIGS. 4A to 4C are graphs respectively illustrating analysis results of magnetic properties at room temperature, at a heat treatment temperature of 350° C., and at a heat treatment temperature of 400° C.

Figure 5:
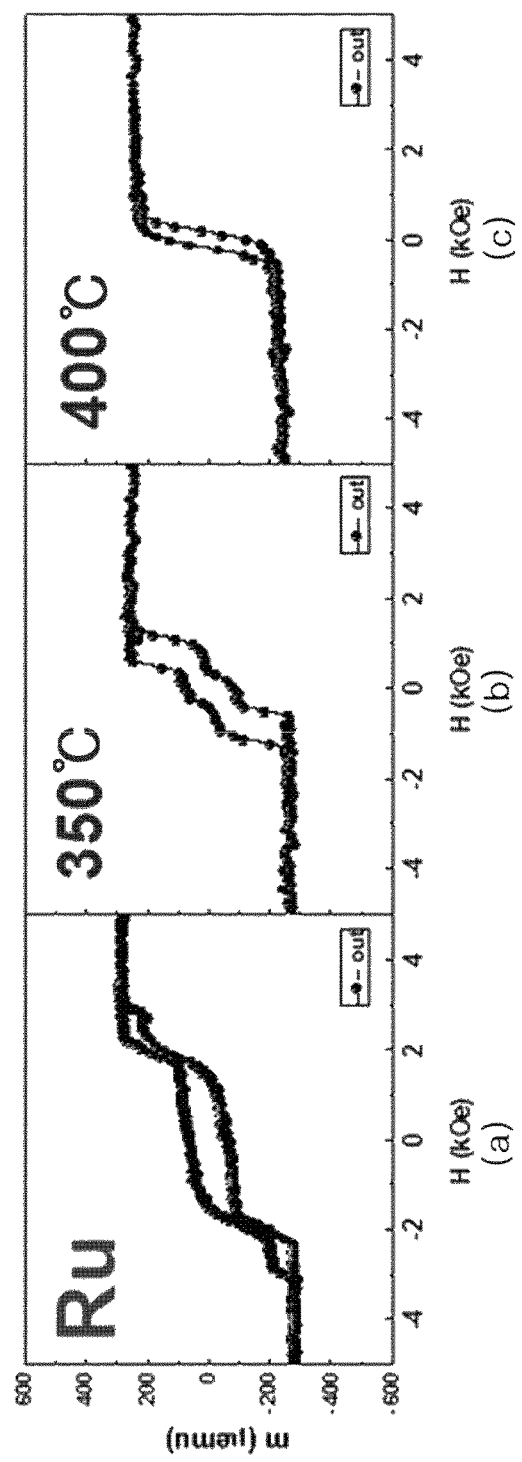
FIGS. 5A to 5C are graphs illustrating magnetic properties according to a heat treatment temperature of a structure according to Manufacturing Example 3.

FIGS. 5A to 5C are graphs illustrating magnetic properties according to a heat treatment temperature of the structure according to Manufacturing Example 3. FIGS. 5A to 5C are graphs respectively illustrating analysis results of magnetic properties at room temperature, at a heat treatment temperature of 350° C., and at a heat treatment temperature of 400° C.

Figure 6:
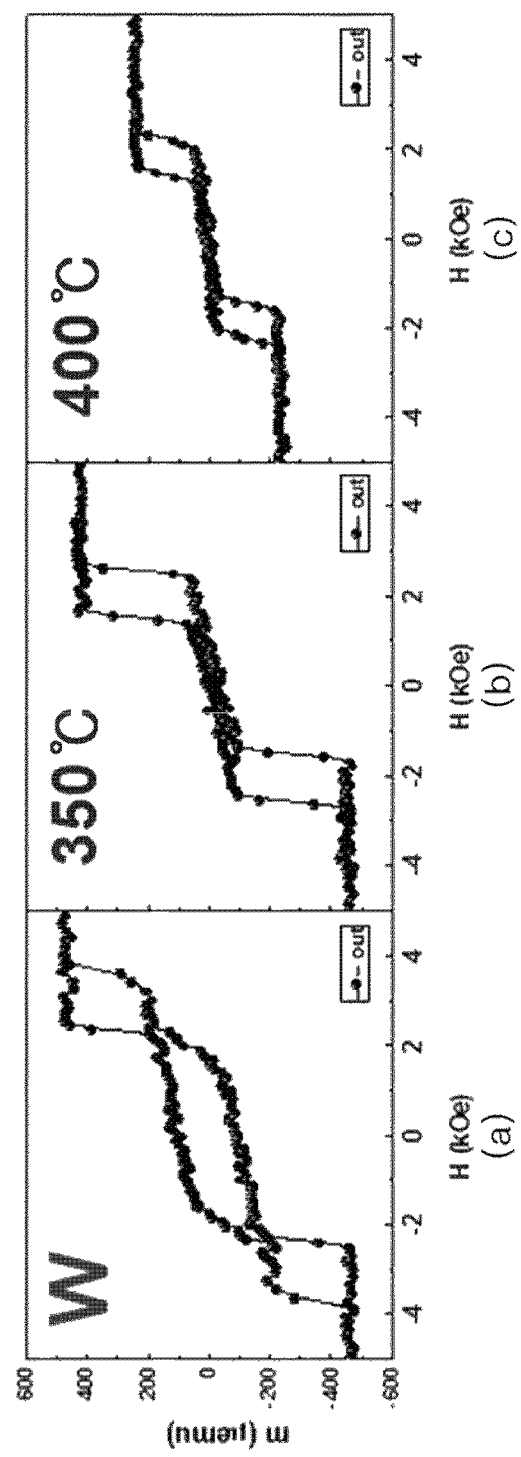
FIGS. 6A to 6C are graphs illustrating magnetic properties according to a heat treatment temperature of a structure according to Manufacturing Example 4.

FIGS. 6A to 6C are graphs illustrating magnetic properties according to a heat treatment temperature of the structure according to Manufacturing Example 4. FIGS. 6A to 6C are graphs respectively illustrating analysis results of magnetic properties at room temperature, at a heat treatment temperature of 350° C., and at a heat treatment temperature of 400° C.

Referring to FIGS. 3A to 5C, it can be seen that magnetic properties of artificial antiferromagnetic layers were weakened at temperatures of 350° C. and 400° C. when Ta, Pd, and Ru were used as a material of a buffer layer. This is because Ta, Pd, and Ru themselves may be diffused in a high-temperature heat treatment process. Thus, it can be seen that the magnetic properties of the artificial antiferromagnetic layers were weakened by the diffusion.

Furthermore, since most of materials such as Ta, Pd and Ru had face centered cubic (FCC) or hexagonal close-packed (HCP) crystalline structures, there was a problem in having appropriate crystalline structure continuity with CoFeB having a BCC structure.

On the contrary, referring to FIGS. 6A to 6C, it can be seen that magnetic properties of artificial antiferromagnetic layers were maintained even at temperatures of 350° C. and 400° C. when W was used as a material of a buffer layer. Therefore, since W was not easily diffused at high temperature when a W-based material was used as a material of a buffer layer, it can be seen that thermal stability was maintained even at high temperature. This is because cohesive energy of the W material itself was higher than that of other materials, so that thermal stability thereof was excellent.

According to the present invention, in applications in which an artificial antiferromagnetic layer is bonded to a CoFeB/MgO/CoFeB structure, the use of a buffer layer therebetween may prevent diffusion of a material such as Pd or Pt in the artificial antiferromagnetic layer into a CoFeB layer.

Furthermore, since a W-based material is used as a material of a buffer layer, coherent tunneling with an MgO tunneling oxide layer may be expected in an actual operation of the element by inducing continuity of a crystalline structure, so that a magnetoresistance ratio may be increased and power consumption may be reduced.

Therefore, a MTJ structure having vertical magnetic anisotropy with improved thermal stability even at high temperature may be provided.

The embodiments disclosed in this specification and drawings are only examples to facilitate an understanding of the invention, and the invention is not limited thereto. It should be apparent to those skilled in the art that various modifications can be made on the basis of the technological scope of the invention in addition to the embodiments disclosed herein.

DETAILED DESCRIPTION OF MAIN ELEMENTS

100: substrate
200: artificial antiferromagnetic layer
210: third ferromagnetic layer
220: separation layer
230: fourth ferromagnetic layer
300: buffer layer
400: first ferromagnetic layer
500: tunneling barrier layer
600: second ferromagnetic layer

The invention claimed is:

1. A magnetic tunnel junction (MTJ) structure having vertical magnetic anisotropy, the MTJ structure comprising:
a substrate;
an artificial antiferromagnetic layer located on the substrate;
a buffer layer located on the artificial antiferromagnetic layer and including W or an alloy containing W;
a first ferromagnetic layer located on the buffer layer, having CoFeB, and having vertical magnetic anisotropy;
a tunneling barrier layer located on the first ferromagnetic layer and having MgO; and
a second ferromagnetic layer located on the tunneling barrier layer, having CoFeB, and having vertical magnetic anisotropy,
wherein the artificial antiferromagnetic layer fixes a magnetic direction of the first ferromagnetic layer, and the buffer layer has a thickness of 2 nm-5 nm to prevent diffusion of material in the artificial antiferromagnetic layer into the first ferromagnetic layer, and
wherein the buffer layer induces continuity of the crystalline structure in the first ferromagnetic layer so that the buffer layer and the first ferromagnetic layer have a body centered cubic structure,
wherein the artificial antiferromagnetic layer includes a third ferromagnetic layer, a separation layer located on the third ferromagnetic layer, and a fourth ferromagnetic layer located on the separation layer.

2. The MTJ structure of claim 1, wherein the third ferromagnetic layer or the fourth ferromagnetic layer includes a CoPd, CoPt, $[Co/Pd]_n$, $[Co/Pt]_n$, FePd, FePt, $[Fe/Pd]_n$, or $[Fe/Pt]_n$ structure, wherein n is an integer greater than or equal to 1.

3. The MTJ structure of claim 1, wherein the separation layer includes Ru, Ta, or Ir.

4. A magnetic element comprising:
a plurality of digit lines;
a plurality of bit lines configured to cross upper portions of the plurality of digit lines; and
the MTJ structure according to claim 1, which is interposed between a digit line of the plurality of digit lines and a bit line of the plurality of bit lines.

* * * * *